United States Patent [19]
Rough et al.

[11] Patent Number: 5,648,664
[45] Date of Patent: Jul. 15, 1997

[54] BIFET VACUUM TUBE REPLACEMENT STRUCTURE

[76] Inventors: J. Kirkwood H. Rough, 264 S. 14th St., San Jose, Calif. 95112; Adrian L. Cogan, 1174 Hyde Ave., San Jose, Calif. 95129; Neill R. Thornton, 39450 Albany Common #W, Fremont, Calif. 94538

[21] Appl. No.: 376,188

[22] Filed: Jan. 20, 1995

[51] Int. Cl.$^6$ .................... H01L 29/74; H01L 29/80
[52] U.S. Cl. .................... 257/135; 257/256; 257/272; 257/273; 257/274; 327/581; 327/599
[58] Field of Search .................... 257/134, 135, 257/256, 266, 272, 273, 274; 315/52; 327/581, 586, 599; 330/227, 296

[56] References Cited

U.S. PATENT DOCUMENTS

| | | | |
|---|---|---|---|
| 3,742,261 | 6/1973 | Schneider et al. | 257/272 |
| 3,953,808 | 4/1976 | Clark et al. | 327/581 |
| 5,321,283 | 6/1994 | Cogan et al. | 257/256 |

OTHER PUBLICATIONS

Chiu & Ghosh, "Characteristics of Junction–Gate Field Effect Transistor with Short Channel Length", *Solid State Electronics*, vol. 14, pp. 1307–1317, 1971.

C. Kim, E. Yang, "Carrier Accumulation and Space–Charge––Limited Current Flow in Field Effect Transistors", *Solid State Electronics*, vol. 13, pp. 1577–1589, 1970.

J. Nishizawa, T. Terasaki, J. Shibata, "Field–Effect Transistor Versus Analog Transistor (Static Induction Transistor)" *IEEE Transactions on Electron Devices*, vol. ED–22, No. 4, Apr. 1975.

A. S. Wang, C.J. Dell'Oca, "A Compatible Bipolar and JFET Process" *IEDM Proc.*, pp. 45–47, Dec. 1976.

J. Nishizawa, *Semiconductor Technology in Japan*, Chapter 15, North Holland, Publisher, NY, pp. 201–219, 1982, "Static Induction Transistor".

M.G. Kane, R. Frey, "The PSIFET Emerges as a New Contender", *MSN*, pp. 46–58, Sep. 1984.

A. Cogan et al., "Progress Toward the Ultimate Semiconductor Switch", *Powertechniques Magazine*, pp. 35–39, Sep. 1986.

J. Browne, "Solid–State Triodes Boost High Voltages at Broad Bandwidths", *Microwaves & RF*, pp. 221–224, May, 1989.

B.J. Baliga, "Bipolar Operation of Power Junction Field Effect Transistors.", *Electronic Letters*, vol. 10, No. 2, Feb. 1980.

*Primary Examiner*—Minh-Loan Tran
*Attorney, Agent, or Firm*—Skjerven, Morrill, MacPherson, Franklin & Friel; Forrest E. Gunnison

[57] ABSTRACT

A BIFET vacuum tube replacement structure includes a plurality of devices that replicate the characteristics of a vacuum tube. The vacuum tube replacement structure has the same pin-out as the vacuum tube being replaced and so can be exchanged directly for a vacuum tube in an audio amplifier. The vacuum tube replacement structure is suitable for use in a wide range of audio amplifier applications without modification to the audio amplifiers. Further, there is no noticeable degradation to the human ear in the sound quality when the vacuum tube replacement structure is used in an audio amplifier in place of a vacuum tube. A unitary device that is a combination of a high impedance bipolar like transistor and a unipolar junction field effect transistor, that is referred to as a BIFET, is used in the vacuum tube replacement structure. In one embodiment, the bipolar like transistor is formed in combination with the gate of the unipolar junction field effect transistor. The vacuum tube replacement structure faithfully replicates input signals at low levels and also slowly and uniformly compresses the input signals at higher drive levels and under overdrive conditions.

10 Claims, 6 Drawing Sheets

BIFET VACUUM TUBE REPLACEMENT STRUCTURE

BACKGROUND OF THE INVENTION

1. Field of the Invention

This invention relates generally to replacements for vacuum tubes and in particular to a replacement for a vacuum tube that replicates the vacuum tube transfer characteristics including the small signal linear amplification and the large signal, i.e., overdrive, amplification.

2. Background of the Invention

Vacuum tubes once were widely used and widely available. However, as semiconductor technology has become more common place, vacuum tubes are now used in only a few applications. Today, one widespread application of vacuum tubes is in audio amplifiers that are used, for example, at concerts, in stereo systems, and in sound studios.

The human ear is a particularly sensitive gauge of the sound quality from an audio amplifier. Typically, important aspects in amplifying music are that the vacuum tubes, or any other devices used for audio amplification, faithfully replicate the input signals at low levels and that the vacuum tubes slowly and uniformly compress the input signals at higher drive levels and under overdrive conditions. Vacuum tubes have these characteristics and it is these characteristics that result in amplified music that is pleasing to the human ear.

Figure 1:
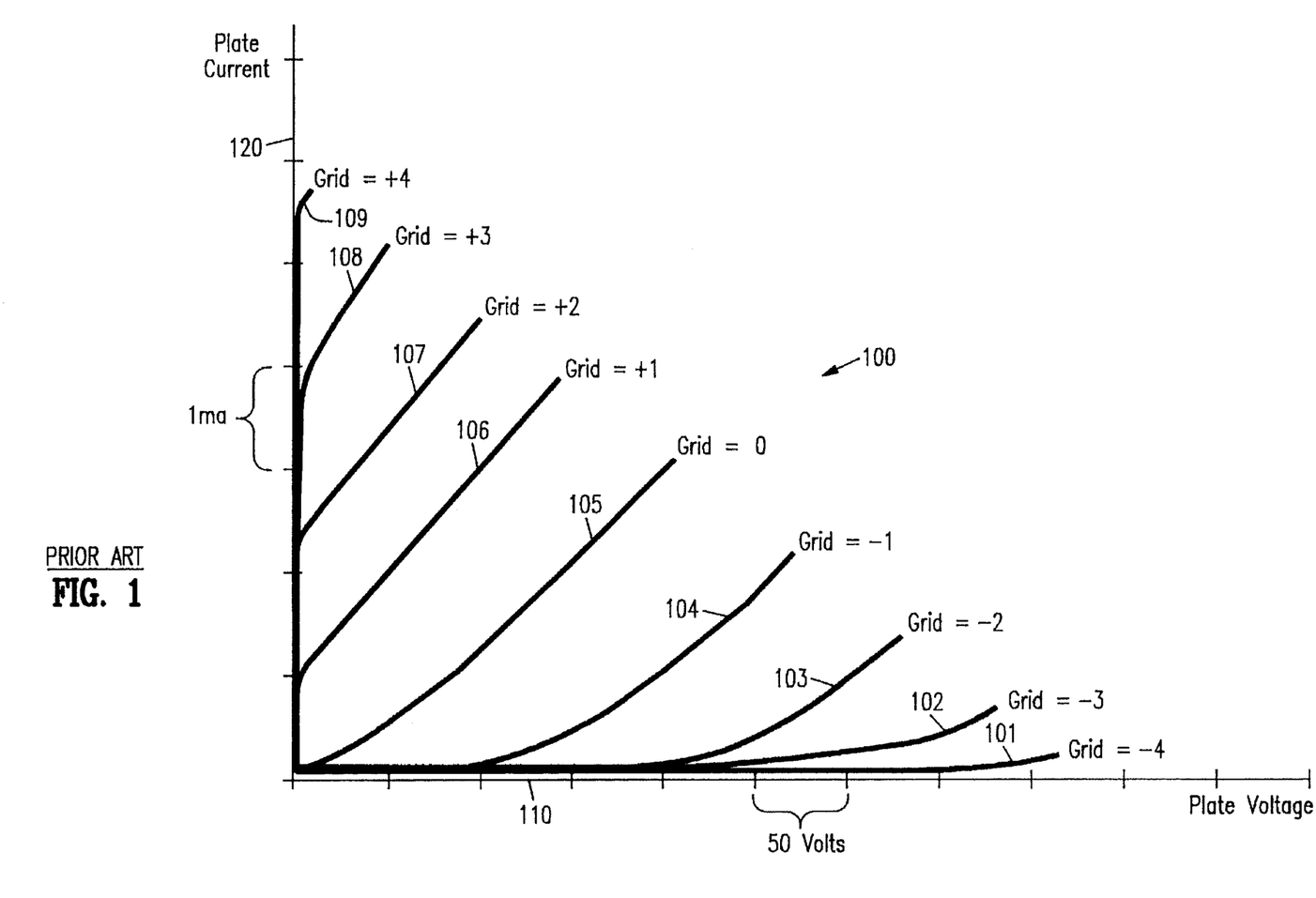
FIG. 1 is a typical set of characteristic curves for a prior triode vacuum tube.

FIG. 1 is a set of characteristic curves 100 for a triode vacuum tube. Horizonal axis 110 is the plate to cathode voltage while vertical axis 120 is the plate current. Each curve 101 to 109 corresponds to a different grid voltage, and there is a one volt change from curve to curve. The curves were generated with a 65 Kohm load. As is known to those skilled in the art, it is important to have the complete set of characteristics curves, i.e., both the positive and negative grid voltages. Any device, that replicates only the negative grid voltage curves and is used in an audio amplifier, fails to slowly and uniformly compress the input signals at higher drive levels and under overdrive conditions.

While vacuum tubes have the desired characteristics for audio amplifiers, the vacuum tube industry is practically non-existent in the United States. Most vacuum tubes are currently being manufactured in foreign countries and unfortunately, not only is the availability of vacuum tubes limited, but also the quality of the vacuum tubes is highly variable. Further, as discussed below, there is not a suitable semiconductor replacement for vacuum tubes.

Bipolar transistors have been used in audio amplifier applications. However, bipolar transistors exhibit non-uniform saturation conditions; non-uniform transfer for amplification which generates odd order harmonics and high output impedance which produce unpleasing sound and so are not suitable for replicating the overdrive characteristics of a vacuum tube.

Figure 2:
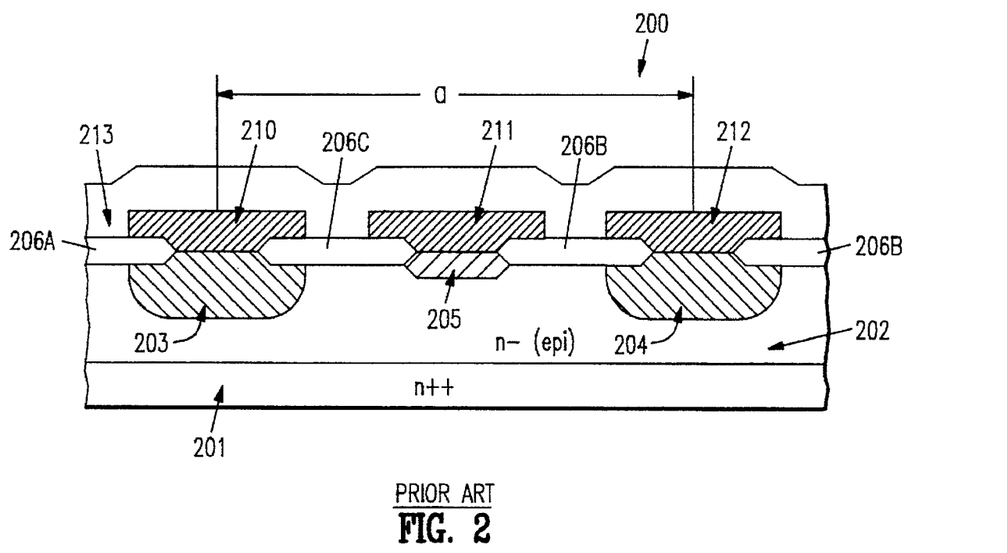
FIG. 2 is a cross sectional view of a prior art short channel JFET.

A short channel JFET 200 has non-saturated current voltage (I-V) characteristics which are similar to those of a vacuum tube triode. The drain of short channel junction field effect transistor (JFET) 200 is a heavily doped region 201 of conductivity type N++. Drain 201 is overlain by a lightly doped epitaxial layer 202 of conductivity type N−. As is known to those skilled in the art, a portion of region 202 functions as the channel of JFET 200.

Two pockets 203, 204 of conductivity type P+, with their centers separated by a distance "a" (the device pitch), extend into epitaxial region 202. Approximately centered between pockets 203, 204 in epitaxial region 202 is a doped source region 205 of conductivity type N+ or N++. An insulating layer 206 (in FIG. 2, a letter is used after reference numeral 206 to identify the different regions of the insulating layer that are visible in the cross-sectional view) overlies surface 202A and has contact openings over pockets 203, 204 and a contact opening over source 205.

Metal gate electrodes 210, 212 electrically contact pockets 203 and 204 respectively and overlie insulating layer 206 so that portions of electrodes 210 and 212 which are not in electrical contact with pockets 203 and 204 are electrically insulated from region 202. Source electrode 211 electrically contacts source 205 and also overlies insulating layer 206 so that portions of electrodes 211 which are not in electrical contact with source 205 are electrically insulated from region 202. A passivation layer 213 overlies electrodes 210, 211, 212 and insulating layer 206.

Figure 3:
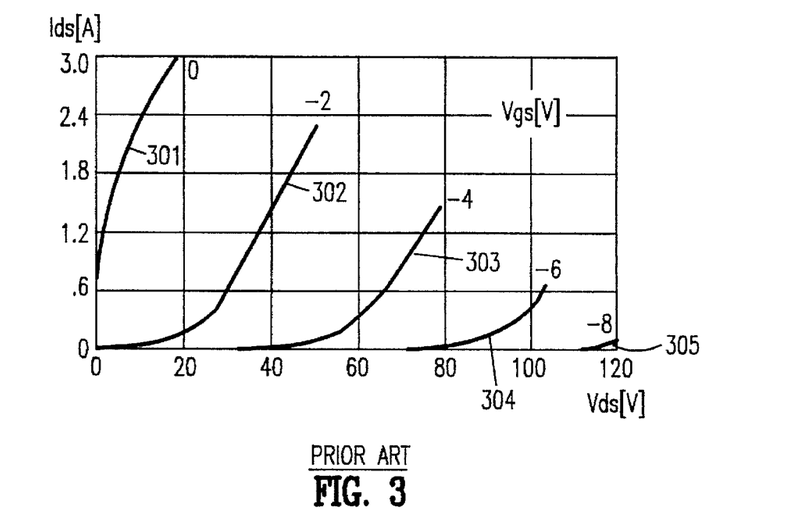
FIG. 3 is a graph of the current-voltage characteristics of the short channel JFET of FIG. 2.

FIG. 3 is a graph of the I-V characteristics for short channel JFET 200. The ordinate of the graph is the drain-to-source current in amps ($I_{DS}[A]$) the abscissa is the drain-to-source voltage in volts ($V_{DS}[V]$). Curves 301, 302, 303, 304, and 305 are for gate-to-source voltages ($V_{GS}[V]$) of 0, −2, −4, −6, and −8 volts respectively.

The drain current of JFET 200 (FIG. 2) is controlled by the (negative) gate potential, as well as the (positive) drain potential. The drain current decreases as the magnitude of the (negative) gate voltage increases. Moreover, the drain current increases with a rise in the drain voltage, a "short channel"-like behavior. Conditions under which semiconductor devices exhibit triode-like I-V characteristics are well-known to those skilled-in-the-art. For example see, G. F. Neumark, E. S. Rittner, "Transition from pentode- to triode-like characteristics in FETs", *SSE*, V10, pp. 299–304, 1967. Other references that define the prior art include: W. Shockley, "Transistorelectronics: imperfections, unipolar and analog transistors", *PIRE*, V40, pp. 1289–1313, November 1952; R. Zuleeg, "Multi-channel FET theory and experiment", *SSE*, V10, pp. 559–576, 1967; Chiu & Ghosh, "Characteristics of Junction-Gate Field Effect Transistor with Short Channel Length", *Solid State Electronics*, Vol. 14, pp. 1307–1317, 1971. C. Kim, E. Yang, "Carrier accumulation and space-charge-limited current flow in FETs", *SSE*, V13, pp. 1577–1589, 1970; J. Nishizawa, T. Terasaki, J. Shibata, "FET versus Analog Transistor (Static Induction Transistor)" IEEE Transaction on Electron Devices, Vol. ED-22, No. 4, April 1975; A. S. Wang, C. J. Dell'Oca, "A compatible bipolar and JFET Process" *IEDM Proc.*, pp. 45–47, December 1976; J. Nishizawa, *Semiconductor Technology in Japan*, Chapter 15, North Holland, Publisher, New York, 1982; M. G. Kane, R. Frey, "The PSIFET emerges as a new contender", *MSN*, pp. 46–58, September 1984; A. Cogan et al. "Progress toward the ultimate semiconductor switch", *Powertechniques Magazine*, pp. 35–39, September 1986; J. Browne, "Solid State Triodes boost high voltages at broad bandwidths", *Microwaves & RF*, pp. 221–224, May, 1989; B. J. Baliga, "Bipolar operation of power JFETs.", *El.Letters*, V10, No. 2, February 1980.

While prior art short channel JFET 200 provides enhanced performance in audio applications over equivalent bipolar and MOS transistors, short channel JFET 200 does not have the overdrive characteristics of a triode vacuum tube. When the gate-to-source junction of JFET 200 (FIG. 2) becomes forward biased, e.g., when the source input signal increases above a certain threshold or power level, i.e, JFET 200 is overdriven, the junction injects minority carriers into the drain-to-source channel. Consequently, unipolar JFET 200 becomes a bipolar transistor, i.e, the input signal has exceeded the bipolar turn-on threshold and JFET 200 may be destroyed by excess current. Also, as described above, a bipolar transistor has does not have the necessary characteristics to replicate the overdrive characteristics of a vacuum tube. Thus, while it is generally known that a short channel JFET 200 has nonsaturated current voltage (I-V) characteristics which are similar to those of a vacuum tube triode, short channel JFET 200 cannot provide the overdrive characteristics that are an important part of music amplification. Consequently, to the best of the inventors knowledge, there is not a suitable replacement for a vacuum tube used in an audio amplifier.

SUMMARY OF THE INVENTION

According to the principles of this invention, a vacuum tube replacement structure includes a plurality of devices that replicate the characteristics of a vacuum tube. The vacuum tube replacement structure has the same pin-out as the vacuum tube being replaced and so can be exchanged directly for a vacuum tube in an audio amplifier. In one embodiment, a vacuum tube replacement structure of this invention is used in low voltage audio amplifier applications, and in another embodiment, a vacuum tube replacement structure of this invention is used in high voltage audio amplifier applications. The vacuum tube replacement structure is suitable for use in a wide range of audio amplifier applications without modification to the audio amplifiers. Further, there is no noticeable degradation to the human ear in the sound quality when the vacuum tube replacement structure is used in an audio amplifier in place of a vacuum tube.

In one embodiment, a semiconductor device is utilized in the vacuum tube replacement structure of this invention. The semiconductor device is a unitary device that is a combination of a high impedance bipolar like transistor and a unipolar junction field effect transistor, that is referred to as a BIFET. In one embodiment, the bipolar like transistor is formed in combination with the gate of the unipolar junction field effect transistor. A vacuum tube replacement structure that includes a BIFET faithfully replicates input signals at low levels and also slowly and uniformly compresses the input signals at higher drive levels and under overdrive conditions. Unlike the prior art short channel JFET, the BIFET matches the characteristics of a vacuum tube over the entire operating range and has a similar input impedance.

In one embodiment, a vacuum tube replacement structure includes a first cathode pin, a first plate pin, a first grid pin, and a first BIFET having a gate of a first conductivity type, a drain, and a source in a layer of a second conductivity type. The gate includes a pocket of the second conductivity type so that the pocket, the gate, and the layer form a structure having the first conductivity type, the second conductivity type, and the first conductivity type, respectively, i.e, a bipolar like transistor. The drain is connected to the first plate pin. The source is connected to the first cathode pin, and the gate is coupled to the first grid pin. Specifically, the pocket in the gate is coupled to the first grid pin.

The vacuum tube replacement structure also includes a second cathode pin, a second plate pin, a second grid pin, and a second BIFET having a gate of a first conductivity type, a drain, and a source in a layer of a second conductivity type. The gate includes a pocket of the second conductivity type so that the pocket, the gate, and the layer form a structure having the first conductivity type, the second conductivity type, and the first conductivity type, respectively, i.e, a bipolar like transistor. The drain is connected to the second plate pin. The source is connected to the second cathode pin, and the gate is coupled to the second grid pin. Specifically, the pocket in the gate is coupled to the second grid pin.

The gate in the BIFET can either be connected directly to a grid pin, or connected to the grid pin through an element that increases the resistance in the gate line. The increased resistance in the gate line spreads out the characteristic curves in the saturated region, i.e, improves the overdrive performance of the vacuum tube replacement structure.

The vacuum tube replacement structure is inserted directly into a vacuum tube socket to substitute the vacuum tube replacement structure for the vacuum tube.

DETAILED DESCRIPTION

According to the principles of this invention, a vacuum tube replacement structure includes a plurality of devices that replicate the characteristics of a vacuum tube. In one embodiment, the vacuum tube replacement structure has the same pin-out as the vacuum tube being replaced and so can be exchanged directly for a vacuum tube in an audio amplifier. No modification or special filters are required to configure the audio amplifier for use with the vacuum tube replacement structure of this invention.

In one embodiment, a vacuum tube replacement structure of this invention is used in low voltage audio amplifier applications, and in another embodiment, a vacuum tube replacement structure of this invention is used in high voltage audio amplifier applications. Moreover, alternative embodiments of the vacuum tube replacement structure are suitable for replacing triode, tetrode, and pentode vacuum tubes. Consequently, the vacuum tube replacement structure of this invention is suitable for use in a wide range of audio amplifier applications without modification to the audio amplifiers. Further, there is no noticeable degradation to the human ear in the sound quality when the vacuum tube replacement structure of this invention is used in an audio amplifier in place of a vacuum tube.

In one embodiment, a semiconductor device is utilized in the vacuum tube replacement structure of this invention. The semiconductor device is a unitary device that is a combination of a high impedance bipolar like transistor and a unipolar junction field effect transistor, that is referred to as a BIFET. In one embodiment, the bipolar like transistor is formed in combination with the gate of the unipolar junction field effect transistor, as described more completely below. The vacuum tube replacement structure that includes a BIFET faithfully replicates input signals at low levels and also slowly and uniformly compresses the input signals at higher drive levels and under overdrive conditions. Unlike the prior art short channel JFET, the vacuum tube replacement structure matches the characteristics of a vacuum tube over the entire operating range and has a similar input impedance.

Figure 4:
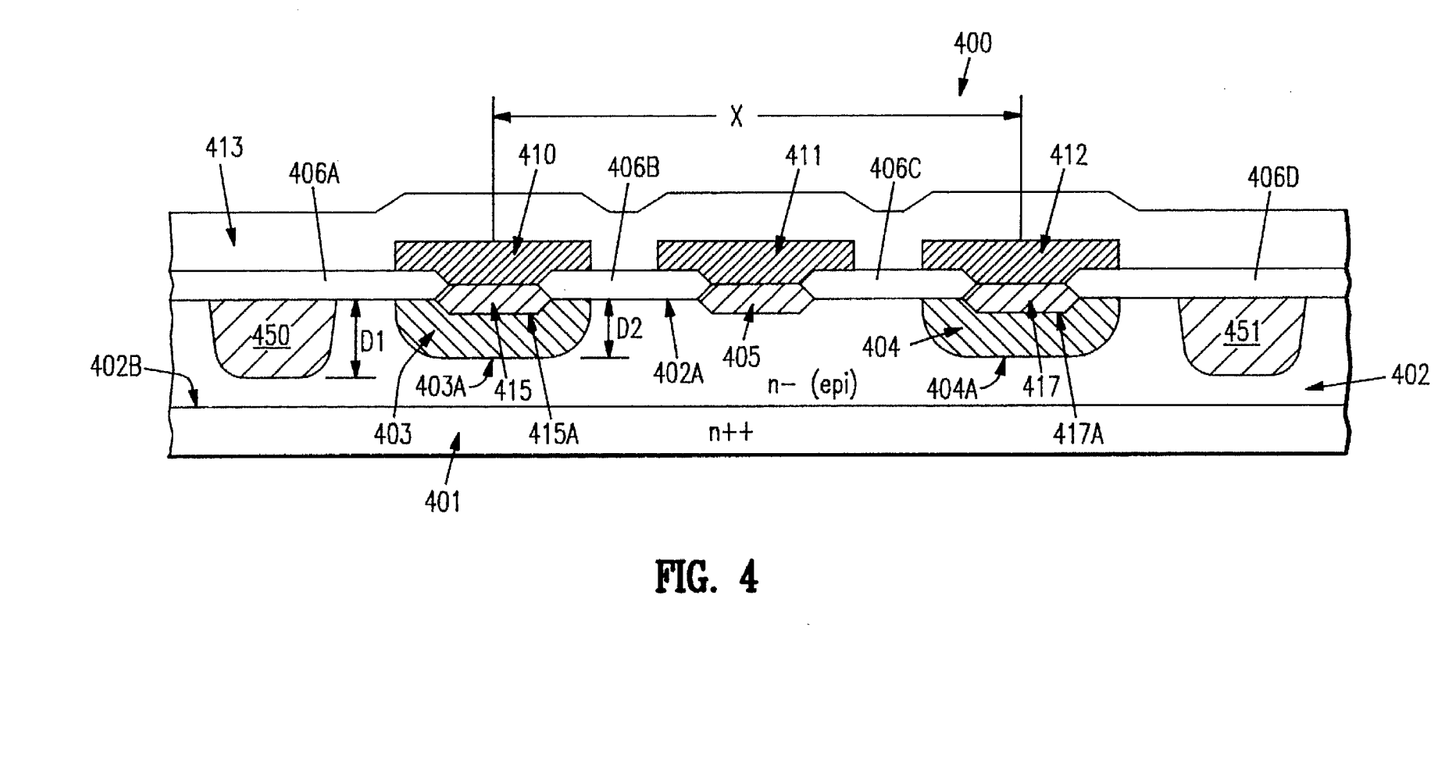
FIG. 4 is a cross sectional view of a BIFET suitable for use in the vacuum tube replacement structure of this invention.

FIG. 4 illustrates a cross-sectional view of one embodiment of a BIFET 400 that has characteristics suitable for use in this invention. A heavily doped region 401, preferably a silicon substrate of a first conductivity, e.g., conductivity type N++, functions as the drain of BIFET 400. Drain 401 is overlying by a lightly doped layer 402 of the first conductivity type and is preferably an epitaxial layer of conductivity type N−. A portion of region 402 functions as the channel of BIFET 400. In one embodiment, epitaxial layer 402 has a thickness in the range of about 2 micrometers ($\mu m$) to about 60 $\mu m$ and is preferably about 30 $\mu m$ thick, and has a resistivity in the range of 0.5 $\Omega$-cm to 60 $\Omega$-cm and preferably about 30 $\Omega$-cm. Herein, "thickness" refers to the distance in a direction perpendicular to the support, e.g., substrate 401, of BIFET 400.

Two pockets 403, 404 of a second conductivity type, with their centers separated by a distance xx (the device pitch), extend into epitaxial region 402A a 5 first predetermined distance D2 from the surface 402A of region 402. Surfaces 403A, 404A of pockets 403, 404 at the first predetermined distance form a diode junction with epitaxial region 402. In this embodiment, pockets 403, 404 are conductivity type P+. Surface 402A is the surface opposite surface 402B of epitaxial region 402 that contacts drain 401.

Within each pocket 403, 404 is a region 415, 417 of first conductivity type N+ that extends into pocket 403, 404 a second predetermined distance from the surface 402A of region 402. Surfaces 415A, 417A of pockets 415, 417 at the second predetermined distance form a diode junction with pockets 403, 404 respectively. Thus, the gate regions of BIFET 400 contain back-to-back diodes and pocket 415, pocket 403, and epitaxial layer 402 form an NPN like transistor, as do pocket 417, pocket 404, and epitaxial layer 402.

Centered between pockets 403, 404 is a doped source region 405 of the first conductivity type, which in this embodiment is conductivity type N+. In this embodiment, source region 405 extends from surface 402A the second predetermined distance into region 402. Preferably, the second predetermined distance is less than the first predetermined distance D2.

In one embodiment, first predetermined distance D2, i.e., the depth of regions 403, 404 in layer 402, is in the range of 0.5 $\mu m$ to 20 $\mu m$ and preferably about 10 $\mu m$. The concentration of dopant atoms in pockets 403 and 404 is about $10^{15}$ to $10^{20}$ atoms/cm$^3$ and preferably about $10^{17}$ atoms/cm$^3$.

The second predetermined distance, i.e., the depth of region 405 in layer 402, is about 0.1 $\mu m$ to 3 $\mu m$ and preferably about 0.5 $\mu m$. The concentration of dopant atoms in pocket 405 is in the range of about $10^{18}$ to $10^{21}$ atom/cm$^3$ and preferably about $10^{21}$ atoms/cm$^3$.

An insulating layer 406, preferably silicon dioxide, overlies surface 402A and has contact openings over pockets 403, 404 and a contact opening over source 405. Insulating layer 406 has a thickness in the range of 0.1 $\mu m$ to 3 $\mu m$, preferably about 1.0 $\mu m$.

Gate electrodes 410, 412 electrically contact pockets 416 and 417 respectively and overlie insulating layer 406 so that portions of electrodes 410 and 412 which are not in electrical contact with pockets 416 and 417 are electrically insulated from region 402. Preferably, gate electrodes 410, 412 are one metal selected from the group of metals consisting of aluminum and PtSi/TiW/Al.

Source electrode 411 electrically contacts source 405 and also overlies insulating layer 406 so that portions of electrodes 411 which are not in electrical contact with source 405 are electrically insulated from region 402. Source electrode 411 is also preferably selected from the group of metals described above. Of course, electrodes 410, 411, 412 may be formed from any conductive material and the source and gate electrodes may be formed of different materials. A passivation layer 413 overlies electrodes 410, 411, 412 and insulating layer 406.

In one embodiment, the vacuum tube being replaced by the semiconductor vacuum tube replacement structure of this invention operates in the 300 to 400 volt range, and so BIFET 400 includes a guard ring 450, 451 of P conductivity type extending a third distance D1 into epitaxial layer 402 while gate regions 403, 404 extend first predetermined distance D2 into epitaxial layer 402. Third and first predetermined distances D1, D2 are selected to optimize the breakdown voltage and performance of BIFET 400. As described above, distance D2 is in the range of 0.5 $\mu m$ to 20 $\mu m$, and preferably about 10 $\mu m$. Distance D1 is in the range of 0.5 $\mu m$ to 20 $\mu m$, and preferably about 10 $\mu m$. If the semiconductor vacuum tube replacement structure of this invention is used in lower voltage applications, the guard ring may not be necessary.

A process for making BIFET 400 is described in commonly assigned U.S. Pat. No. 5,321,283, entitled "High Frequency JFET" issued on Jun. 14, 1994 to Cogan et al. which is incorporated herein by reference in its entirety.

While in this embodiment, BIFET 400 is a vertical semiconductor structure, BIFET 400 could be implemented as a planar semiconductor structure. In addition, multiple BIFETs can be implemented on a single chip or alternatively a BIFET could be implemented with discrete components. Those skilled in the art will appreciate that while an N-channel BIFET 400 is described herein, BIFET 400 can also be constructed and operated as a P-channel device. Further, BIFET 400 can be implemented in other than silicon semiconductor technology.

Unlike prior art short channel JFETs that did not reproduce all of the desirable vacuum tube characteristics, when positive voltages are applied to the gate of BIFET 400, BIFET 400 does not fail like short channel JFET 200. Further, BIFET 400 does not have the undesirable bipolar transistor characteristics of non-uniform saturation conditions and non-uniform transfer for amplification which generates odd order harmonics. Therefore, a semiconductor vacuum tube replacement structure that includes BIFET 400 provides overdrive performance similar to a vacuum tube and small signal amplification similar to a vacuum tube and so is suitable for use in audio amplifiers. In addition, the input impedance and signal to noise characteristics are similar to those of a vacuum tube. Prototype BIFET devices have been successfully used to replace vacuum tubes in that the sound degradation of prior-art short channel JFETs was eliminated.

Figure 5:
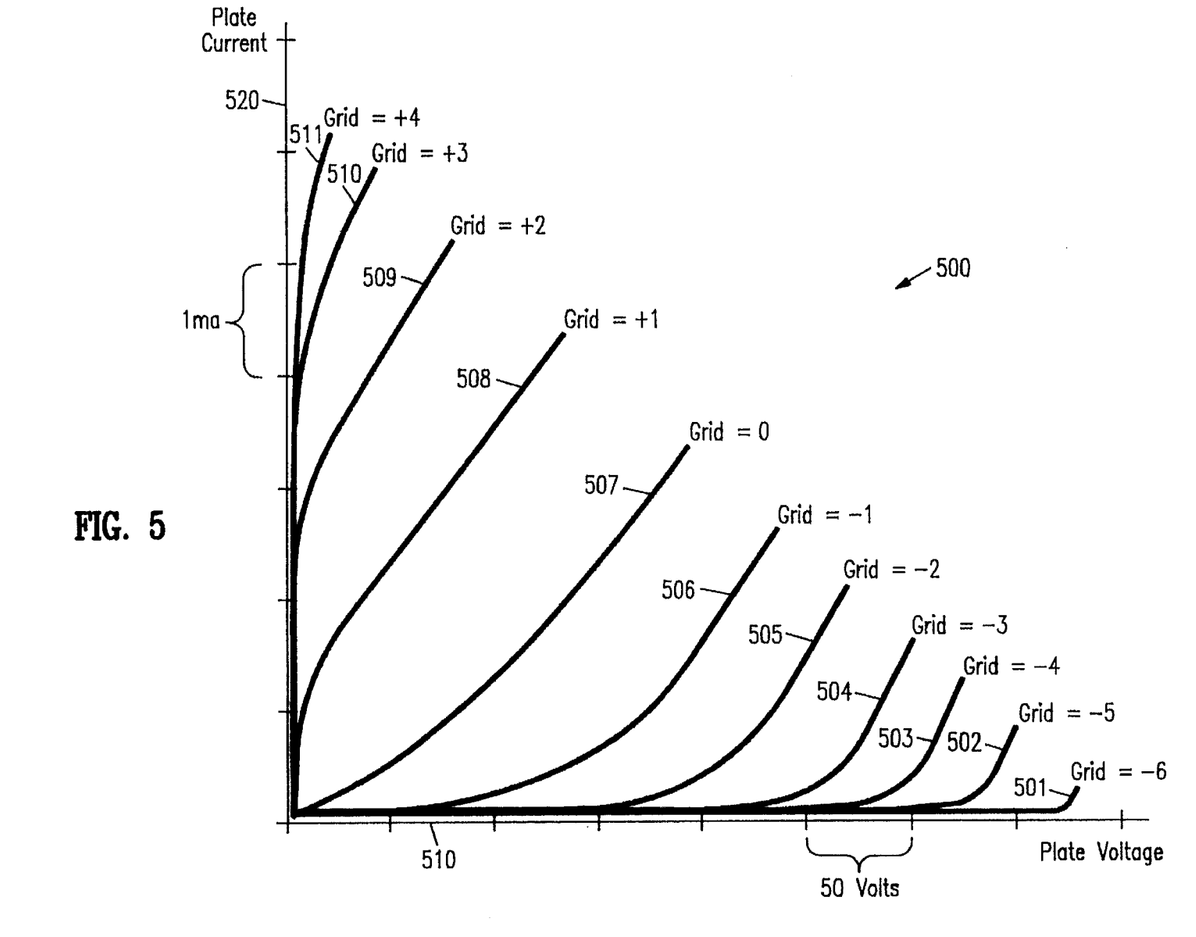
FIG. 5 is a graph of drain-to-source current vs. drain-to-source voltage for BIFET 400 for different values of the gate-to-source voltage.

FIG. 5 is a plot of the characteristics curves of BIFET 400 with a 15 Kohm series resistance in the gate line. Horizontal axis 510 is the anode (drain-to-source) voltage while vertical axis 520 is the anode current in milliamps. Each curve 501 to 511 corresponds to a particular grid (gate-to-source) voltage and there is a one volt change from curve to curve. The curves were generated with a 65 Kohm load. In FIG. 5, the voltages apins of the vre those on the pins of the vacuum tube replacement structure. Notice, that the grid voltage can be positive in a manner similar to the vacuum tube characteristic curves in FIG. 1. Also, the small signal amplification is similar to that for the vacuum tube. Overall, the characteristics curves of BIFET 400 with the series resistance are substantially similar to the vacuum tube characteristic curves of FIG. 1.

Figure 6A:
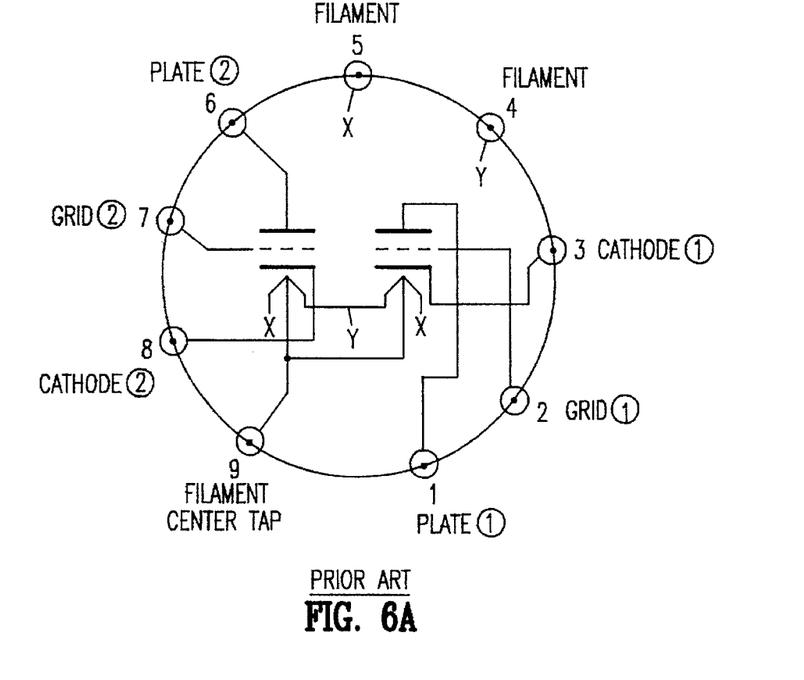
FIG. 6A is a schematic diagram of a prior art dual triode vacuum tube.

In one embodiment, the semiconductor vacuum tube replacement structure of this invention is used to replace, for example, any one of the following dual triode vacuum tubes 12AX7, 12AT7, 12AU7, 12AY7, and 12AV7, 12BH7 and similar vacuum tubes. FIG. 6A is schematic diagram of a representative pin-out for these vacuum tubes. Pin 1 is connected to the plate of the first vacuum tube triode and pin 6 is connected to the plate of the second vacuum tube triode. Pin 2 is connected to the grid of the first vacuum tube triode and pin 7 is connected to the grid of the second vacuum tube triode. Pin 3 is connected to the cathode of the first vacuum tube triode and pin 8 is connected to the cathode of the second vacuum tube triode. Pins 4 and 5 are connected the outer filament connections while pin 9 is connected to the filament center tap which allows the vacuum tube triode to operate off 6.3 volts by connecting pins 4 and 5 together. If the voltage is connected across pins 4 and 5, the vacuum tube operates on 12 volts and pin 9 is not used.

Figure 6B:
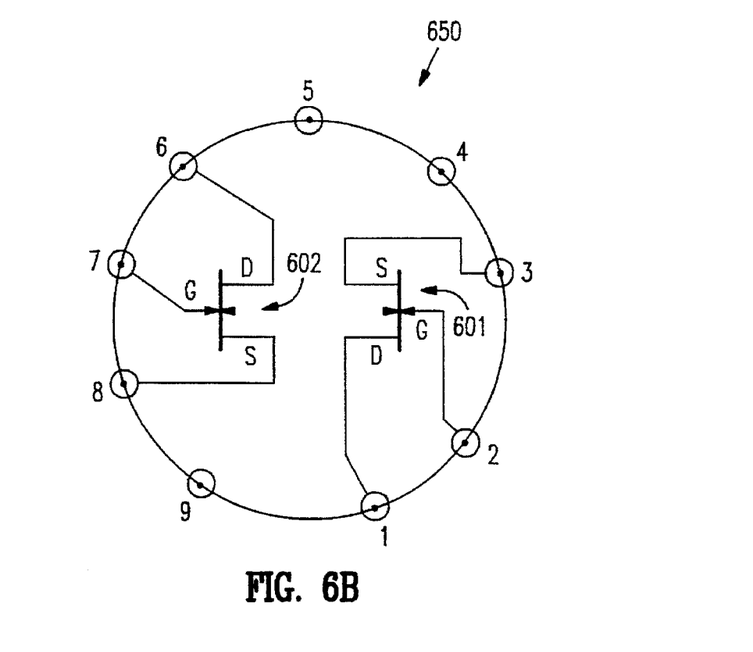
FIG. 6B is a schematic diagram of a first vacuum tube replacement structure for the prior art dual triode vacuum tube of FIG. 6A.

According to the principles of this invention, the pin-out for a dual-triode semiconductor vacuum tube replacement structure 650 is identical to that in FIG. 6A. Specifically, as shown in FIG. 6B, plate pin 1 is connected to drain D of a first BIFET 601 that is the plate replacement. In this embodiment, grid pin 2 is directly connected to gate G of BIFET 601 that is the grid replacement, and cathode pin 3 is connected to source S of BIFET 601 that is the cathode replacement. Similarly, plate pin 6 is connected to drain D of a second BIFET 602 that is the plate replacement. Grid pin 7 is connected directly to gate G of BIFET 602 that is the grid replacement, and cathode pin 8 is connected to source S of BIFET 602 that is the cathode replacement. Pins 4, 5, and 9 are not used and are simply dummy pins. Dual-triode semiconductor vacuum tube replacement structure 650 is enclosed in a can to facilitate plugging and removing structure 650 from the vacuum tube socket.

Figure 6C:
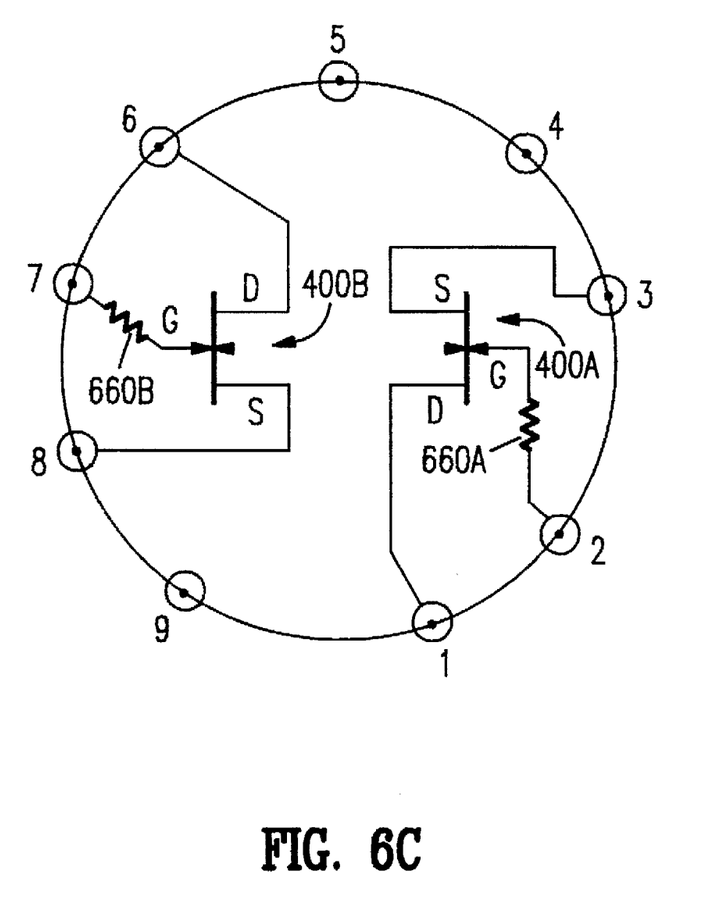
FIG. 6C is a schematic diagram of a second vacuum tube replacement structure for the prior art dual triode vacuum tube of FIG. 6A.

Herein, when it is stated that gate G of a BIFET is connected to the grid pin, it means, for example, that electrodes 410 and 412 of BIFET 400 are connected by a gate line to the grid pin. As explained above, a gate line is connected to a pocket 415 of one conductivity type that is contained within another pocket 403 of a conductivity type opposite to the one conductivity type where pocket 403 is the gate of BIFET 400. In the embodiment which was used to generate the curves in FIG. 5, BIFET 400A (FIG. 6C) was used and a 15 Kohm resistor 660A was connected in series between the gate line for BIFET 400A and grid pin 2. The other connections are the same as in FIG. 6B. Similarly, resistor 660B was inserted in the gate line for BIFET 400B. Herein, BIFETs 400A and 400B (FIG. 6C) are the same as BIFET 400 (FIG. 4). The series resistance in the gate line spread out the saturation curves for BIFET 400, i.e., the overdrive characteristics. Thus, in this embodiment, gate G of BIFET 400 is coupled to the grid pin. Alternatively, the series resistance is included with the silicon structure of BIFET 400.

While a specific embodiment for replacement of a triode vacuum tube has been illustrated, combinations of BIFETs 400 could be used to replace tetrode and pentode vacuum tubes. Thus, the embodiments described herein are illustrative only of the principles of this invention and are not intended to limit the scope of the invention to the particular embodiments described. In view of this disclosure, those skilled in the art can use a combination of a high resistance bipolar transistor and a JFET or devices having similar characteristics to the combination to replicate the performance of any vacuum tube of interest.

We claim:

1. A vacuum tube replacement structure comprising:
 a first cathode pin;
 a first plate pin;
 a first grid pin; and
 a first BIFET having a gate of a first conductivity type, a drain, and a source in a layer of a second conductivity type opposite to said first conductivity type;
  wherein said gate includes a pocket of said second conductivity type so that said pocket, said gate, and said layer form a structure having said second conductivity type, said first conductivity type, and said second conductivity type, respectively;
 said drain is connected to said first plate pin;
 said source is connected to said first cathode pin; and
 said pocket in said gate is coupled to said first grid pin.

2. A vacuum tube replacement structure as in claim 1 further comprising:
 a second cathode pin;
 a second plate pin;
 a second grid pin; and
 a second BIFET having a gate of a first conductivity type, a drain, and a source;
  wherein said gate includes a pocket of said second conductivity type so that said pocket, said gate, and said layer form a structure having said second conductivity type, said first conductivity type, and said second conductivity type, respectively;
 said drain is connected to said second plate pin;
 said source is connected to said second cathode pin; and
 said pocket in said gate is coupled to said second grid pin.

3. A vacuum tube replacement structure as in claim 2 further comprising a first resistive element connected between said pocket in said gate of said first BIFET and said first grid pin.

4. A vacuum tube replacement structure as in claim 3 further comprising a second resistive element connected between said pocket in said gate of said second BIFET and said second grid pin.

5. A vacuum tube replacement structure as in claim 1 further comprising a resistive element connected between said pocket in said gate of said first BIFET and said first grid pin.

6. A vacuum tube replacement structure as in claim 1 further wherein said pocket in said gate of said first BIFET is connected directly to said first grid pin.

7. A vacuum tube replacement structure as in claim 3 wherein said pocket in said gate of said second BIFET is connected directly to said second grid pin.

8. A vacuum tube replacement structure as in claim 2 wherein said pocket in said gate of said second BIFET is connected directly to said second grid pin.

9. A method for replacing a vacuum tube having a grid pin, a cathode pin, and a plate pin comprising:

connecting a drain of a BIFET to a plate pin;

connecting a source of said BIFET to a cathode pin; and coupling a pocket of a second conductivity within a gate of a first conductivity type of said BIFET to a grid pin wherein said connection of said drain and said source and said coupling of said pocket within said gate form a vacuum tube replacement structure.

10. The method of claim 9 further comprising:

inserting said vacuum tube replacement structure into a socket for said vacuum tube.

* * * * *